United States Patent [19]

Peterson

[11] Patent Number: 4,534,604
[45] Date of Patent: Aug. 13, 1985

[54] VERTICAL MOUNTING DEVICE FOR ELECTRICAL CIRCUIT BOARD COMPONENTS

[76] Inventor: Steven G. Peterson, R.R. 2, Box 202C, Waseca, Minn. 56093

[21] Appl. No.: 588,045

[22] Filed: Mar. 9, 1984

[51] Int. Cl.³ .............................................. H01R 23/72
[52] U.S. Cl. .............................. 339/17 D; 339/17 LC; 339/125 R
[58] Field of Search ................. 339/17 R, 17 C, 17 D, 339/17 LC, 125 R, 125 L, 128, 91 R; 361/400, 403, 405, 406, 408, 417, 418

[56] References Cited

U.S. PATENT DOCUMENTS

| | | | |
|---|---|---|---|
| 3,706,954 | 12/1972 | Krafthefer | 339/91 R |
| 4,184,730 | 1/1980 | Huebner | 339/17 LC |
| 4,200,347 | 4/1980 | Sinclair et al. | 339/17 LC |
| 4,390,224 | 6/1983 | Showman et al. | 339/17 LC |

FOREIGN PATENT DOCUMENTS 140533 3/1980 Fed. Rep. of Germany ...... 361/403

*Primary Examiner*—Neil Abrams

[57] ABSTRACT

A mounting device for stacking of electrical components at an upright angle relative to the planar surface of an electrical circuit board is provided. The mounting device includes a base portion that is affixed to the surface of an electrical circuit board, and an upright portion snapably received by the base portion. The upright portion includes a front wall having a plurality of longitudinally spaced apart receptacles, and a stepped rear wall. Lead channels extend between the receptacles and the stepped rear wall. Electrical leads of components received within the front wall receptacles are led through the channels to the stepped rear wall. The lead portions extending beyond the rear wall may be bent along the stepped portions into generally parallel relationship with the front, with the stepped portions maintaining the leads in spaced apart relationship.

3 Claims, 10 Drawing Figures

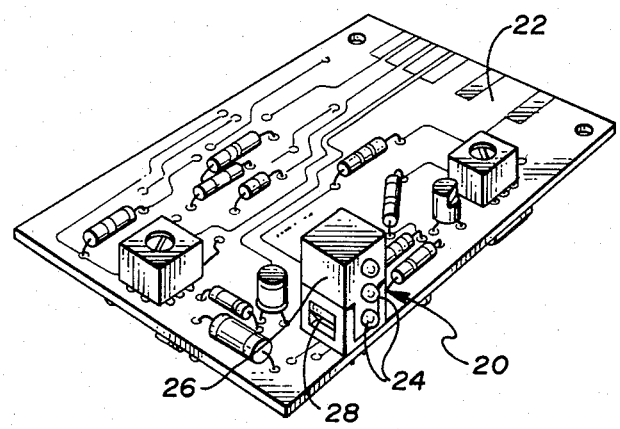
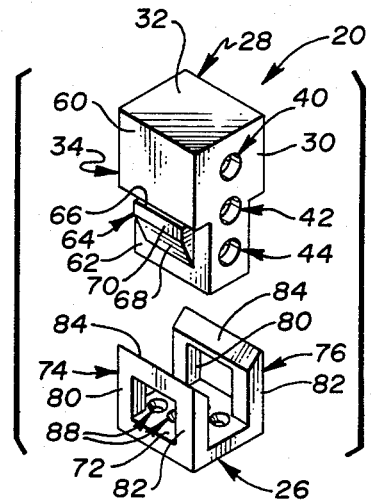
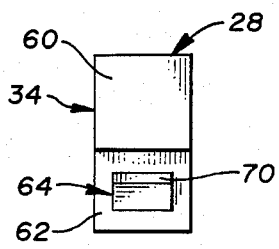
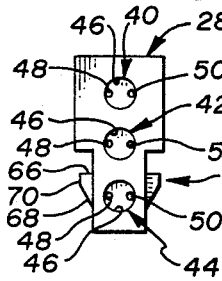
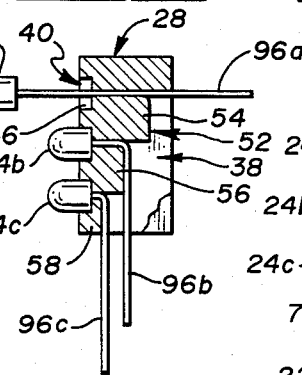
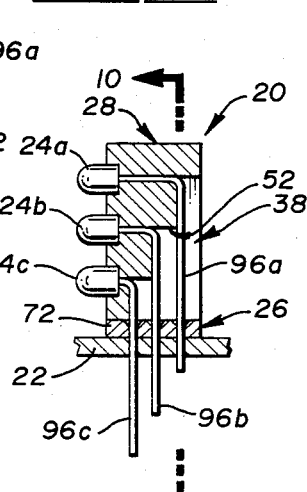
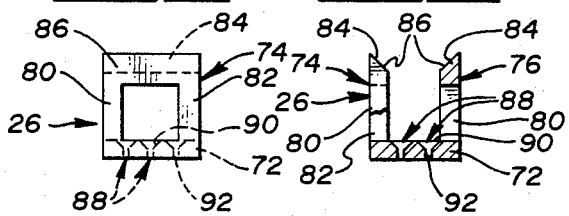
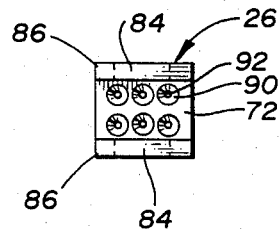

VERTICAL MOUNTING DEVICE FOR ELECTRICAL CIRCUIT BOARD COMPONENTS

TECHNICAL FIELD

This invention relates to the mounting of electrical components on circuit boards. In particular, it pertains to a mounting device for the stacking of electrical components at an upright angle relative to the planar surface of an electrical circuit board.

BACKGROUND

The trend in the construction of electrical circuits has been to make the circuits as compact as possible. One aspect of this trend has been to manufacture printed circuit boards with as many discrete components as possible compacted onto the surface area of an individual board. Heretofore, the individual circuit elements on a printed circuit board have been space apart in horizontal orientation; that is to say spaced along the generally planar surface of the board.

It would be desirable, in some instances, to be able to vertically stack individual circuit elements; that is to say, stack the individual circuit elements at an angle relative to the planar surface of the circuit board.

SUMMARY OF THE INVENTION

The mounting device for electrical components in accordance with the present invention in large measure solves the problem outlined above. That is to say, the mounting device hereof provides for the upright stacking of individual circuit elements relative to the generally planar surface of a circuit board. The area of a circuit board available for mounting additional electrical components, therefore, is greatly increased.

The upright stacking component hereof broadly includes a socket portion that may be fixedly attached to the surface of a printed circuit board, and an upright portion that is snapably received by the socket portion.

BRIEF DESCRIPTION OF THE DRAWINGS

FIG. 1 is a perspective view of a printed circuit board having a mounting device in accordance with the present invention mounted thereon;

FIG. 2 is an exploded, perspective view of a mounting device in accordance with the present invention;

FIG. 3 is a side view of the upright portion of the present invention;

FIG. 4 is a front elevational view of the upright portion of the present invention;

FIG. 5 is a side elevational view of the socket portion of the mounting device in accordance with the present invention;

FIG. 6 is a fragmentary, sectional view of the socket portion;

FIG. 7 is a bottom view of the socket portion;

FIG. 8 is a fragmentary, sectional view of the upright portion of the mounting device in accordance with the present invention, with a plurality of electrical elements mounted therein;

FIG. 9 is a sectional view of a mounting device in accordance with the present invention fixed to a circuit board, and having a plurality of elements mounted therein; and FIG. 10 is a sectional view taken along the line 10—10 of FIG. 9.

DETAILED DESCRIPTION OF THE DRAWINGS

Referring to the drawings, a mounting device 20 in accordance with the present invention is depicted in FIG. 1, mounted on a printed circuit board 22. A plurality of light emitting diodes (LEDs) 24 are depicted mounted within the device 20. The mounting component 20 includes a lower socket portion 26 and upper, upright portion 28.

Upright portion 28 includes T-shaped front wall 30, top wall 32, and opposed, stepped side walls 34, 36. The bottom and rear sides of the upright portion 28 are open to expose interior stepped cavity 38.

A set of three, vertically oriented apertures 40, 42, 44 extend from front wall 30 to the interior cavity 38. As best seen in FIGS. 4 and 8, apertures 40, 42, 44 each include circular component receiving receptacles 46, and a pair of generally parallel, spaced apart, lead channels 48, 50 extending from the component receiving receptacles 46 to the interior cavity 38.

Interior cavity 38 is defined in part by stepped interior wall 52. As best seen in FIG. 8, interior wall 52 includes a plurality of steps 54, 56, 58. The uppermost edge of each step is defined by the intersection of respective lead channels 48, 50 with interior cavity 38.

Referring to FIGS. 2 and 3, stepped side walls 34, 36 include upper portion 60, and receded portion 62. A snap element 64 is integrally carried by the receded portion 62 of each side wall 34, 36. Each portion 62 includes a top wall 66 perpendicular with the main surface of portion 62, an inclined bottom wall 68, and a side wall 70 that is generally parallel to the surface of the main portion 62.

Socket portion 26 includes base plate 72 and upwardly extending, opposed side walls 74, 76. Each side wall 74, 76 includes an aperture 78 therein such that each side wall 74, 76 is defined by a pair of upwardly extending legs 80, 82 and a top bar 84 interconnecting respective legs 80, 82. Top bar 84 includes beveled upper edge 86.

Base plate 72 includes a plurality of of apertures 88 extending between the upper and lower surface of the plate 88. Each aperture 88 includes a frustoconical upper portion 90, and a lower channel 92.

The socket portion 26 and upright portion 28 of the mounting component 20 are each preferably integrally molded from a suitable synthetic resin.

In operation, socket portion 26 is fixedly attached to a circuit board 22 by an adhesive or any other suitable means. A plurality of electrical elements such as LEDs 24, having a body portion 94 and electrical leads 96, 98, may be inserted in the upright mounting portion apertures in vertical orientation. In particular, LEDs 24a, 24b, 24c may be inserted in apertures 40, 42, 44 such that the portions 94a, 94b, 94c of the LEDs are received within respective receptacles 46 of apertures 40, 42, 44, and respective leads 96a, 98a, 96b, 98b, 96c, 98c are received within respective LED channels 48, 50.

Referring in particular to FIGS. 8 and 9, the respective leads 98, 96 of each LED 24 are bent around the respective stepped portion 54, 56, 58 of interior wall 52 such that the leads extend downwardly within cavity 38 in spaced apart relationship. As depicted in FIGS. 9 and 10, leads 96, 98 are received through respective apertures 88 in base plate 72 of socket portion 26, upon insertion of the upright portion 28 into the socket portion 26.

Insertion of the upright portion 28 into socket portion 26 causes bottom wall 68 of respective snap elements 64 to come into sliding engagement with the beveled top edges 84 of socket portion side wall top bars 84. Side walls 74, 76 are formed from resilient synthetic resin and will bend outwardly as the upright portion 28 is inserted into the socket portion 26. Once the top wall 66 of snap portions 64 passes beneath the top bar 84 of respective side walls 74, 76, the side walls 74, 76 will snap into locking engagement with snap elements 64, fixedly securing the upright portion 28 within socket portion 26. Respective leads 96, 98 may then be connected in electrically conducting relationship to the various other electrical elements carried by circuit board 22.

I claim:

1. A mounting device for the upright mounting, on a printed circuit board or the like, of electrical components having electrical leads, comprising:

a base portion adapted for operable coupling with said board, including:

a base plate adapted to be affixed to said board, said plate including a plurality of spaced apart base plate apertures for receiving said leads;

a pair of opposed, resilient sidewalls extending upwardly from said base plate, each of said base plate sidewalls including a beveled upper edge and structure defining latch receiving apertures;

an upright portion snapably received by said base portion, said upright portion including:

a front wall;

a rear wall in opposed relationship with said front wall, said rear wall defining a plurality of stepped portions;

structure defining a plurality of upright portion apertures extending between said front wall and said rear wall for receiving said electrical leads, said upright portion apertures being longitudinally spaced apart relative to said upright portion front wall for maintaining said leads in spaced apart relationship, said upright portion apertures intersecting said rear wall at different ones of said stepped portions whereby the leads extending through said upright portion apertures beyond said rear wall can be bent about said stepped portions into generally parallel relationship with said front wall while maintaining their spaced apart relationship; and opposed sidewalls, each sidewall having an upper portion and a lower portion recessed relative to said upper portion, said sidewall lower portions each including an outwardly extending snap element having an inclined bottom wall, said snap element bottom wall and said base plate sidewall beveled upper edge being of generally equal slope for mutual sliding engagement upon insertion of said upright portion into said base portion, said snap elements being snapably received within said base portion sidewall apertures, and respective ones of said base portion sidewalls and said upright portion sidewall upper portions being generally aligned so as to collectively define opposed, generally planar, mounting device sidewalls, when said upright portion is snapably received within said base portion.

2. A mounting device as claimed in claim 1, said upright portion apertures comprising sets of longitudinally spaced apart pairs of laterally spaced apart channels.

3. A mounting device as claimed in claim 1, said upright portion apertures each including electrical component receiving receptacles along said front wall, and lead-receiving channels extending between said receptacles and said rear wall.

* * * * *

UNITED STATES PATENT AND TRADEMARK OFFICE
CERTIFICATE OF CORRECTION

PATENT NO. : 4,534,604
DATED : August 13, 1985
INVENTOR(S) : Steven G. Peterson

It is certified that error appears in the above-identified patent and that said Letters Patent is hereby corrected as shown below:

On the title page insert:

-- /73/ Assignee: E. F. Johnson Company, Waseca, Minn. --.

On the title page, after "Primary Examiner" insert

-- Attorney, Agent, or Firm - Dorsey & Whitney --.

Signed and Sealed this

Seventh Day of January 1986

[SEAL]

Attest:

DONALD J. QUIGG

Attesting Officer

Commissioner of Patents and Trademarks